United States Patent
Tsironis

(10) Patent No.: US 10,637,179 B1
(45) Date of Patent: Apr. 28, 2020

(54) HERMETIC RF CONNECTION FOR ON-WAFER OPERATION

(71) Applicant: Christos Tsironis, Dollard-des-Ormeaux (CA)

(72) Inventor: Christos Tsironis, Kirkland (CA)

(*) Notice: Subject to any disclaimer, the term of this patent is extended or adjusted under 35 U.S.C. 154(b) by 339 days.

(21) Appl. No.: 15/440,734

(22) Filed: Feb. 23, 2017

Related U.S. Application Data

(60) Provisional application No. 62/299,718, filed on Feb. 25, 2016.

(51) Int. Cl.

| | |
|---|---|
| *H01R 13/52* | (2006.01) |
| *G01R 31/28* | (2006.01) |
| *G01R 1/04* | (2006.01) |
| *H01R 11/18* | (2006.01) |
| *H01R 24/40* | (2011.01) |
| *H01R 103/00* | (2006.01) |

(52) U.S. Cl.
CPC ....... *H01R 13/5205* (2013.01); *G01R 1/0416* (2013.01); *G01R 31/2822* (2013.01); *H01R 11/18* (2013.01); *H01R 24/40* (2013.01); *H01R 2103/00* (2013.01)

(58) Field of Classification Search
None
See application file for complete search history.

(56) References Cited

U.S. PATENT DOCUMENTS

| | | | | |
|---|---|---|---|---|
| 4,731,577 | A * | 3/1988 | Logan | G01R 1/07342 324/750.29 |
| 6,232,788 | B1 * | 5/2001 | Schwindt | A46D 1/00 324/750.19 |
| 7,278,887 | B1 * | 10/2007 | Palinkas | H01R 13/719 439/620.03 |
| 9,335,345 | B1 | 5/2016 | Tsironis | |
| 2009/0004918 | A1 * | 1/2009 | Papanide | H01R 24/44 439/620.03 |
| 2014/0231133 | A1 * | 8/2014 | Fritz | H02G 3/22 174/650 |

OTHER PUBLICATIONS

MPI Manual System, photographed during EdiCon 2015 show in Beijing, China 2015.
"On Wafer Load Pull Tuner Setups", Application Note 48, Figures 6 to 8 and 18, Focus Microwaves, Dec. 2001.
"Conductive EPDM FOAM", Jinan EMI Shielding Technology Co. Ltd., http://www.emishielding.com.cn/product/Conductive-EPDM-FOAM.html Feb. 19, 2016.
"EMI/RFI-shielded glass 9600 series", Holland Shielding Systems BV, http://hollandshielding.com/231-EMI%20shielded%20glass Feb. 19, 2016.

\* cited by examiner

*Primary Examiner* — Paresh Patel

(57) ABSTRACT

A hermetically sealed link for low loss coaxial airline connection between the wafer probe and the RF connector of an external instrument with 30 or 45 degrees wafer probes allows continuous, micro-positioner controlled, 3 axis horizontal and vertical probe movement. A flexible sealing ring ensures airtight and/or RF-EMI shielded operation. A metallic or plastic collar ensures wafer testing under EMI, airtight or high temperature conditions.

6 Claims, 15 Drawing Sheets

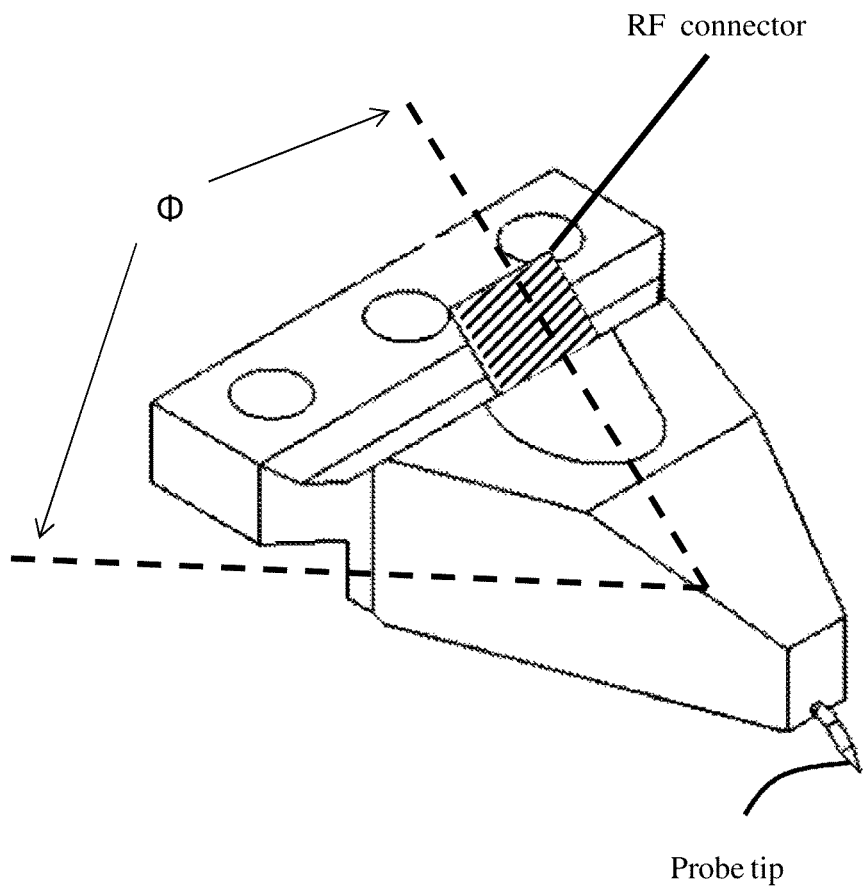
FIG. 1: Prior art

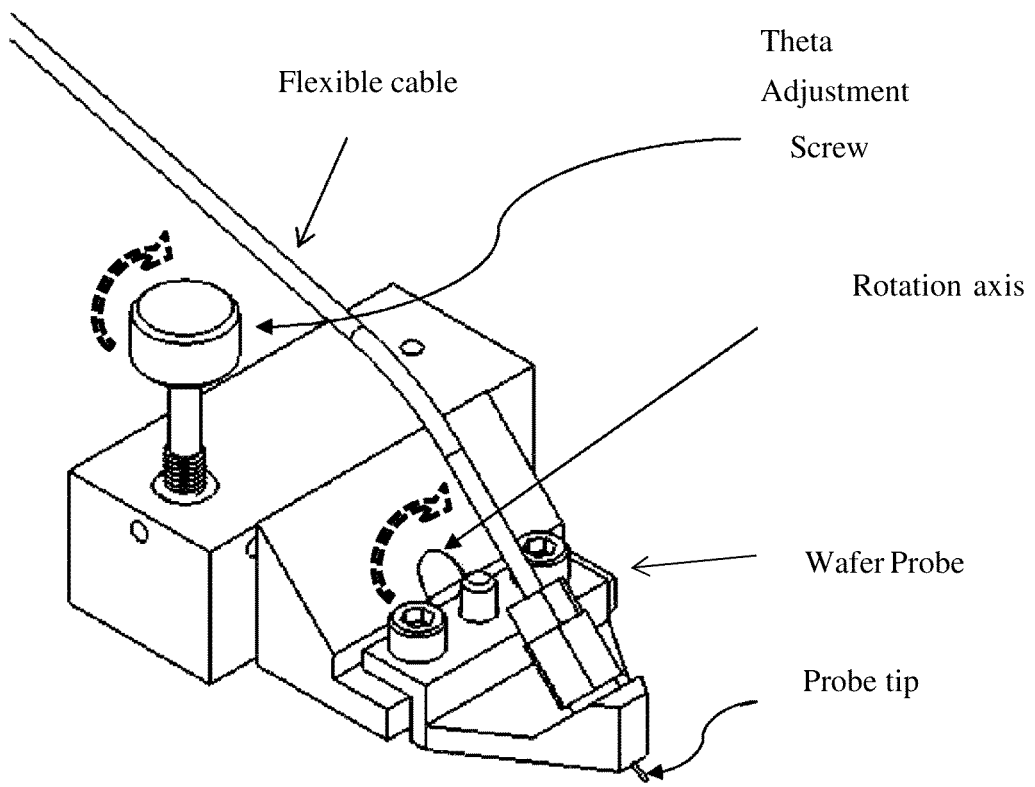
FIG. 2: Prior art

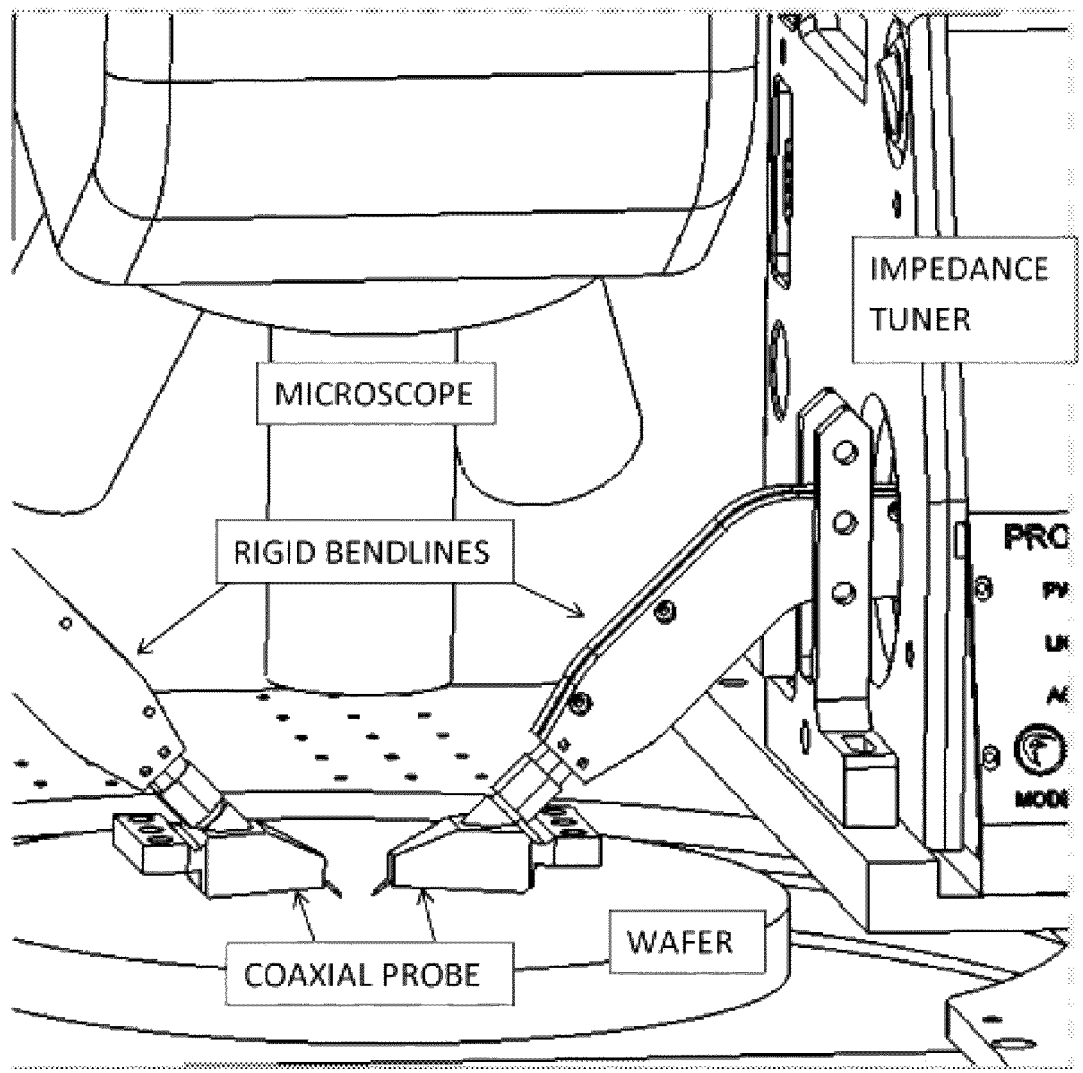
FIG. 3: Prior art

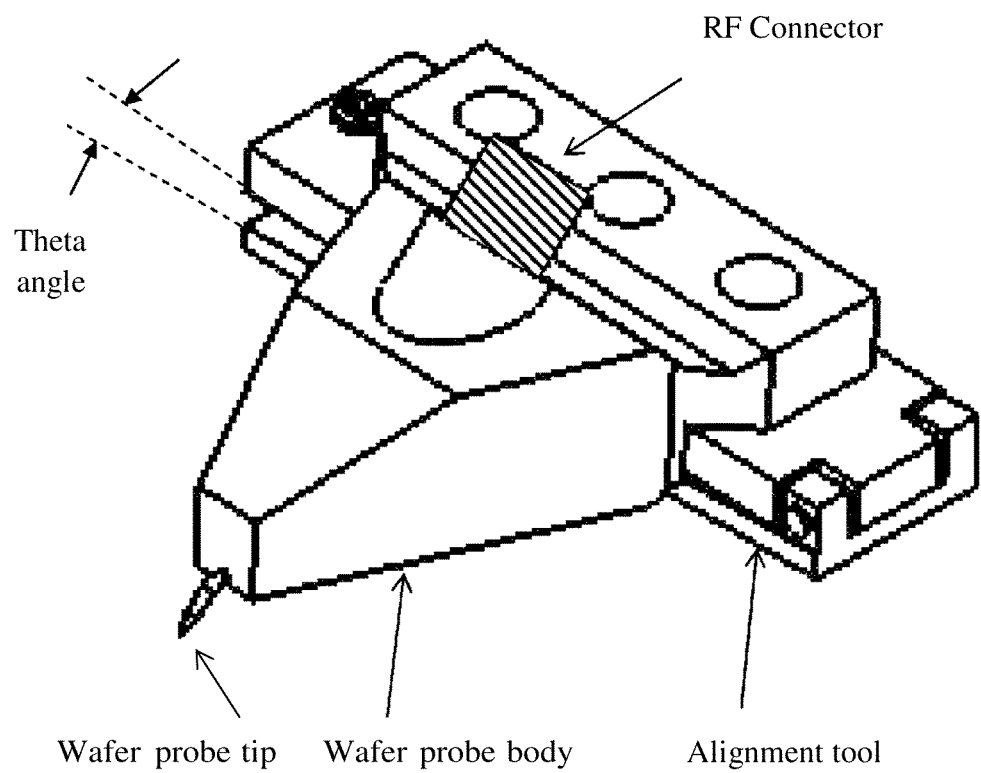
FIG. 4: Prior art

FIG. 5A: Prior art
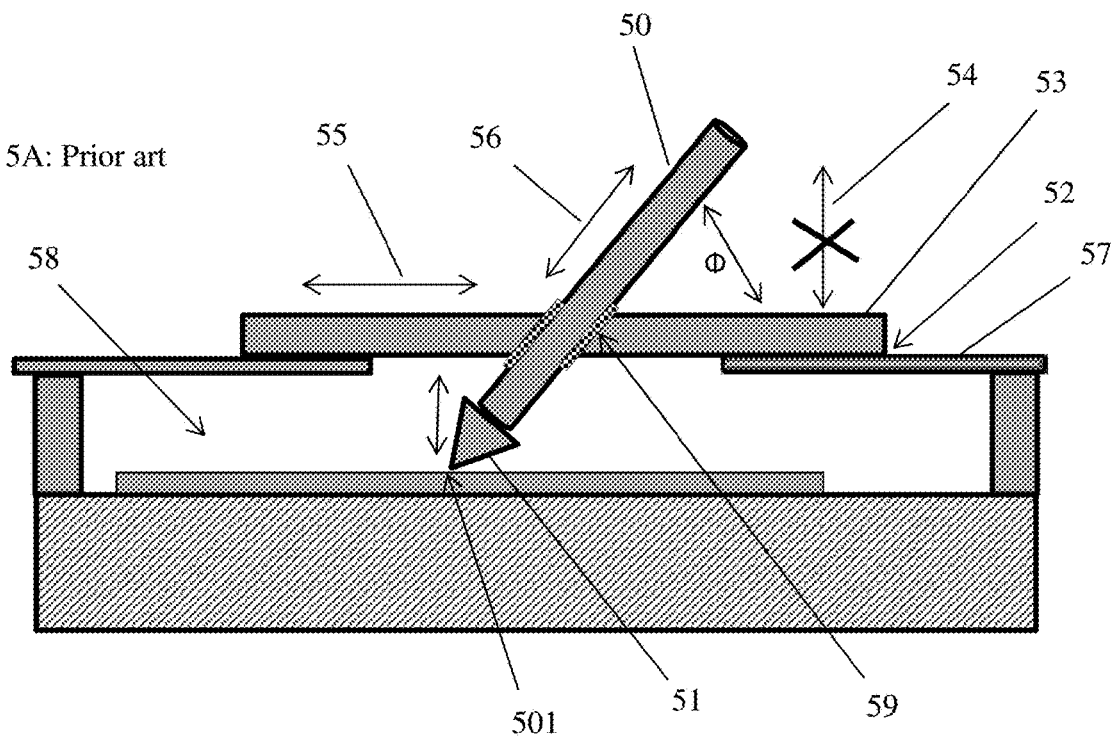
FIG. 5B: Prior art
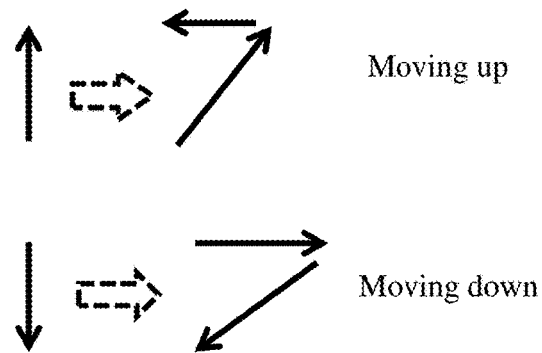
Moving up
Moving down

FIG. 6A: Prior art
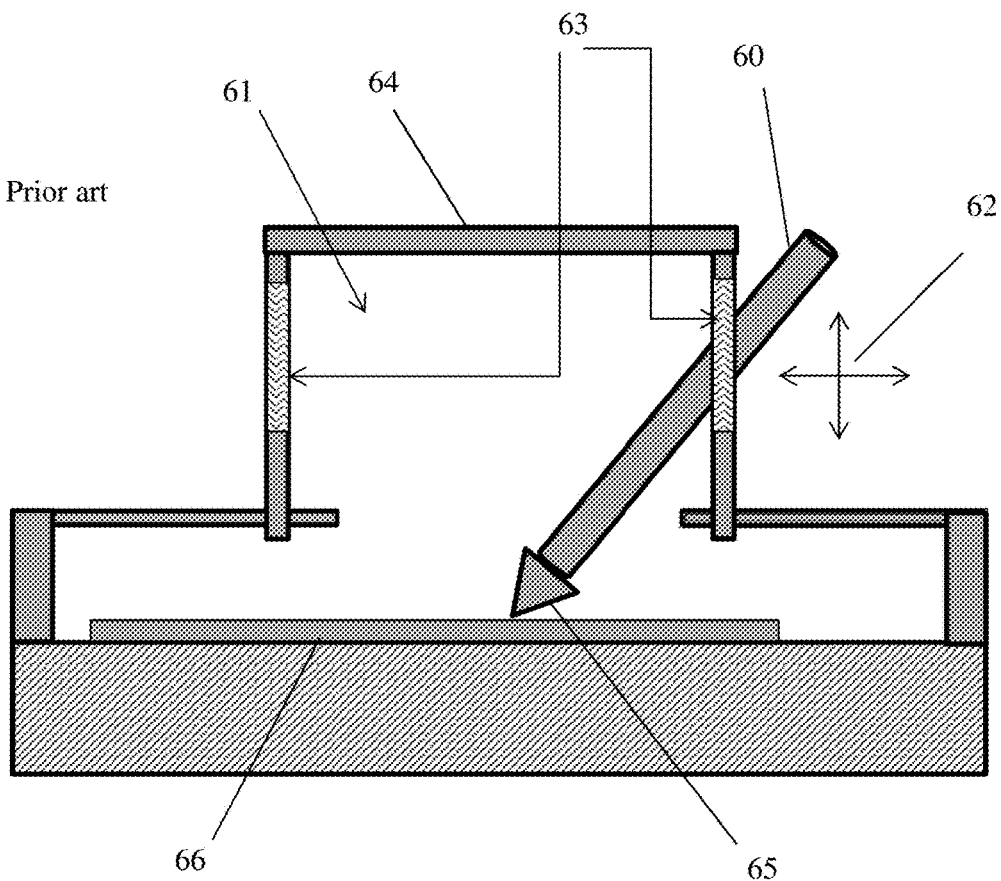
FIG. 6B: Prior art
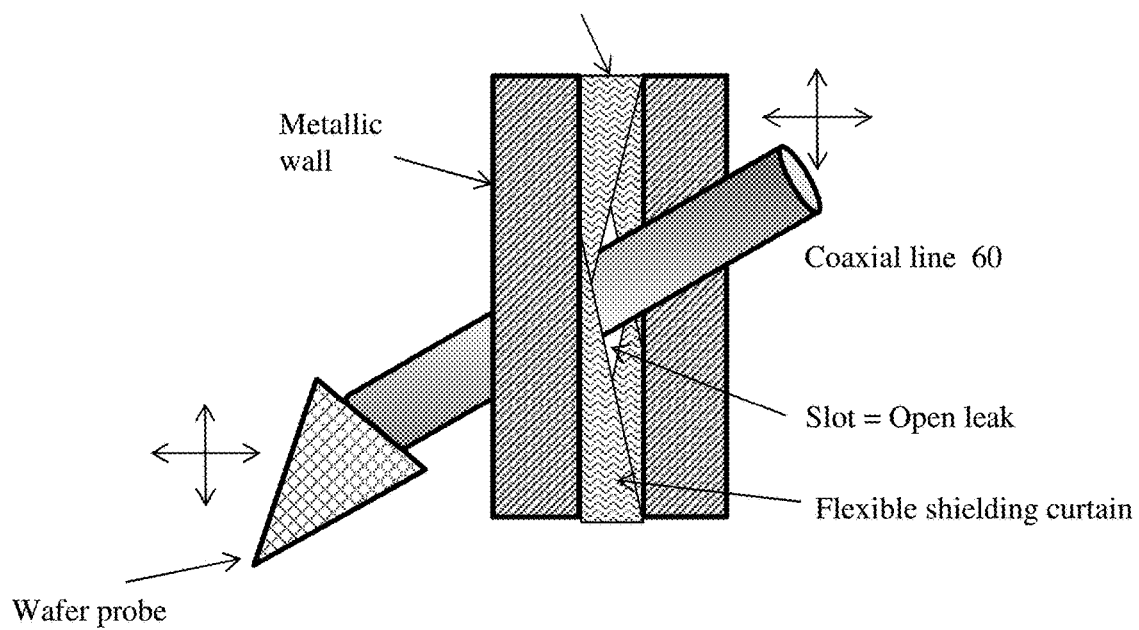

HERMETIC RF CONNECTION FOR ON-WAFER OPERATION

PRIORITY CLAIM

This application claims priority on provisional application No. 62/299,718, titled "A Hermetic RF Connection for On-Wafer Operation", filed on Feb. 25, 2016.

CROSS-REFERENCE TO RELATED ARTICLES

1. "High-frequency Performance with Low, Stable Contact Resistance on Aluminum Pads", Infinity probe, Cascade Microtech, http://www.cascademicrotech.com/products/probes/rf-microwave/infinity-probe/infinity-probe
2. "High Performance Microwave Probes", Model 40M Low Loss Picoprobe, GGB Industries Inc., http://www.ggb.com/40m.html
3. MPI Manual Probe System, photographed during EdiCon 2015 show in Beijing, China
4. "On Wafer Load Pull Tuner Setups", Application Note 48, FIGS. 6 to 8 and 18, Focus Microwaves, December 2001
5. Tsironis, U.S. Pat. No. 9,335,345, "A Method for Planarity Alignment of Waveguide Wafer Probes"
6. "Conductive EPDM FOAM", Jinan EMI Shielding Technology Co. Ltd., http://www.emishielding.com.cn/product/Conductive-EPDM-FOAM.html
7. "EMI/RFI-shielded glass 9600 series", Holland Shielding Systems BV, http://hollandshielding.com/231-EMI%20shielded%20glass

BACKGROUND OF THE INVENTION

Prior Art

RF and microwave devices and circuits (DUT) are best characterized in chip form "on wafer". This allows avoidance of parasitic connection elements, like wire bonds and fringe capacitors, which are associated with packaging the devices in order to mount them in test fixtures. It also allows a much larger number of devices to be tested "in situ" without having to laboriously slice the wafer, mount and wire-bond each individual chip. The "on wafer" testing is at this time the preferred testing method, except for very high power devices, beyond (typically) 20 Watt RF power. On wafer testing is also the exclusive testing method in millimeter-wave frequencies, since device packaging is extremely difficult and the parasitic elements associated with the package (inductance of wire bonds and fringe capacitors of package housings) would falsify the measured data to the point of uselessness.

A number of manufacturers (see ref. 1, 2 and 3) make wafer probes (FIG. 1) capable of reliably testing microwave chips. The microwave probes (FIGS. 1, 2) are made, usually, using small coaxial cables with diameters of the order of 1 mm (0.04"), embedded in a solid body; the coaxial cables end into a "coplanar" structure, where the center conductor of the coaxial cable becomes the center conductor of the coplanar and the ground mantle of the coaxial cable ends up as the ground plane of the coplanar (FIG. 2). The simple reason is that this is a practical way the RF signal can be injected and retrieved from planar micro-chips, where all RF contacts are on the same surface.

The test conditions are carried through, beyond the normal RF injection and DC biasing conditions, either in normal (dust-free) laboratory environment or under special, temperature and vacuum or radiation conditions. To do so an enclosure is needed to shield the wafer from the environment. Commercially available solutions to the encapsulation requirement are shown in FIGS. 5 (see ref. 4) and 6 (see ref. 3). In the case of FIG. 6 the shielding is not leak-free, since the RF cable (60) leading into the protective chamber (61), and which is required to move the probe (65) horizontally and vertically (62), in order to make or break the contact with the wafer (66), has to traverse a slot (63) on each side of the enclosure (64), which is filled with a curtain of flexible material (conductive mesh foam or rubber), which must have a slot for allowing the vertical movement (62) of the cable (60), which creates a leak through the opening and therefore cannot ensure hermetical sealing of the cavity (61).

In the case of FIGS. 5A and 5B, the RF signal guide (50) reaches the wafer probe (51) under an angle (D, typically 30 or 45 degrees) and must make hermetic contact (59) with the cover plate (53) in which case, because the contact (52) between the cavity cover (57) and the movable cover plate (53) must also remain hermetical, a direct vertical movement (54) is impossible: to make or break contact with the chip (501) the probe (51) has to move back and forth (56) and forward-backward (55) as shown in FIGS. 5A and 5B. As shown in FIG. 5B to move the probe up or down requires a two-step procedure: to move up one has to move the probe back first and then left, to move the probe down one has to move the probe right first and then forward. For the left probe the movements are corresponding. In either case using the X-Y probe positioners of the probes or of the attached equipment (FIG. 9) require special skill and the contact process is critical.

BRIEF SUMMARY OF THE INVENTION

This invention claims a new solution allowing direct vertical and horizontal movement control of the wafer probe combined with perfect shielding of the wafer area from the environment; additionally the proposed solution also allows using wafer probes of various angles, as well as a link to either RF coaxial cable or the extended airline of impedance tuners (see ref. 4). The solution comprises a probe holder and a cover plate and is shown schematically in cross section in FIGS. 7 through 10. Sealing is obtained using simple straight rubber pieces and gaskets in form of O-rings. In a detailed configuration (FIG. 10) provision is also taken to allow probe "Theta" angle alignment before closing the cavity (Theta alignment for this application is shown in FIG. 4) by making the cavity cover in two pieces, the bigger one holding the sealing links and the smaller one allowing access to the probes before sealing.

DESCRIPTION OF THE VARIOUS VIEWS OF THE DRAWINGS

The invention can be better understood in view of the attached drawings:

FIG. 1 depicts prior art: a microwave wafer probe.

FIG. 2 depicts prior art: a Theta (planarity) alignment mechanism for wafer probes.

FIG. 3 depicts prior art: a complete on-wafer test setup using impedance tuners and rigid extended coaxial airlines between the tuners and the probes.

FIG. 4 depicts prior art: a static Theta alignment mechanism for wafer probes, using and adjustable and removable support device.

FIGS. 5A through 5B depict prior art: 5A depicts a hermetic wafer test chamber using sloped rigid links between the wafer probe and the test instrument; 5B depicts the necessary trajectory of the probe movement. A picture of such setup is shown in ref. 3.

FIGS. 6A through 6B depict prior art: 6A depicts and cross section of a shielded wafer test chamber using a cap and shielding curtained slots on the sides to allow traversing the test cable connecting to the probe; 6B depicts the curtained slot itself and the unavoidable cavity hindering the hermeticity.

DETAILED DESCRIPTION OF THE INVENTION

As explained before, existing solutions for hermetically shielding the cavity surrounding the semiconductor wafer in a wafer probe station are either imperfect (FIG. 6) or impractical to use (FIGS. 5A and 5B). The herein proposed solution cures these shortcomings, by using a device, as part of an assembly, which ensures hermetical operation, normal handling and compatibility with existing probe stations. The complete solution comprises three parts: a) a cover made of two pieces (items (70) in FIG. 7 and (100) in FIG. 10), and b) two probe holding devices ((71) and (101) correspondingly). Each probe holding device, shown in FIGS. 7, 8 (80), 9 (90) and 10 (101) comprises a vertical massive cylinder, which can be made of metal or plastic and a traversing high conductivity metallic tube (item (72) in FIG. 7, item (81) in FIG. 8 etc.), which traverses at a predetermined angle and forms a straight continuation of the angle of the coaxial connectors attached to the wafer probes (FIGS. 1, 4 and (82) in FIG. 8). This metallic tube (81) in fact is the external conductor of a coaxial, low loss transmission line, which serves as a link between the wafer probe and the extended airline of the associated instrument, this being an impedance tuner or any other external box.

Figure 7:
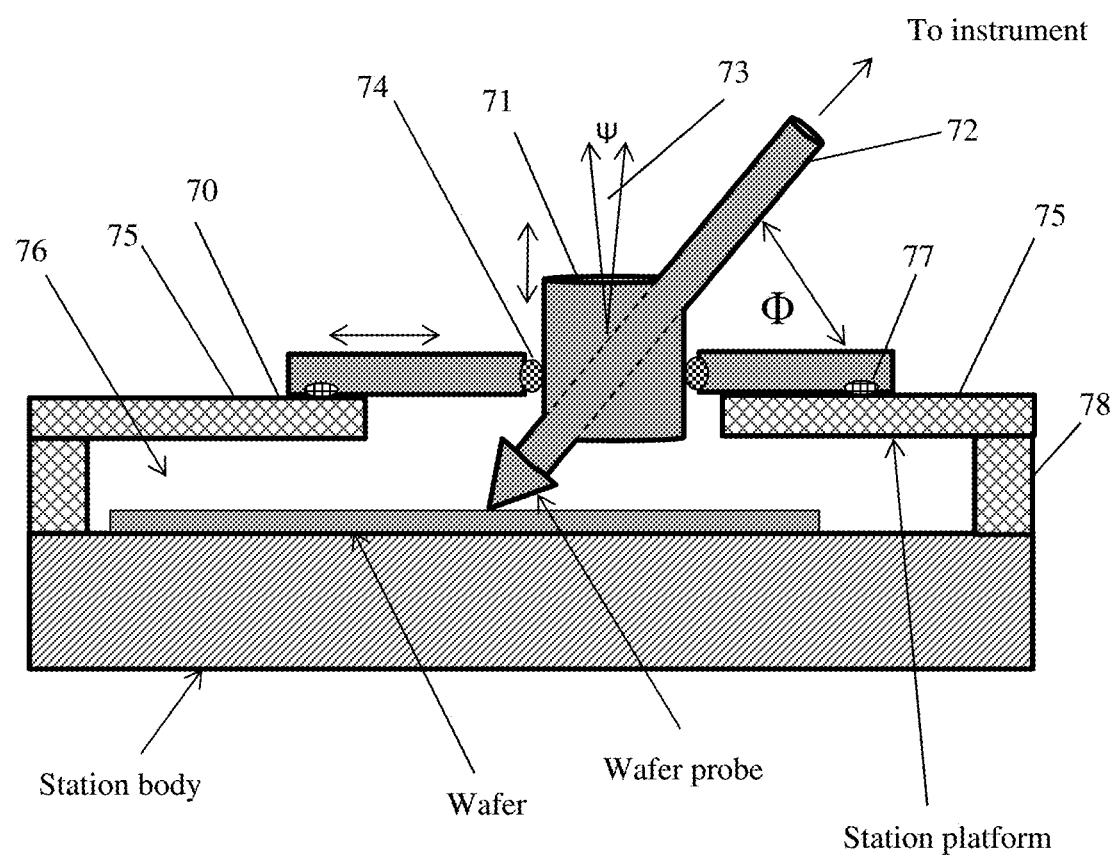
FIG. 7 depicts a hermetic wafer test chamber using a vertically and horizontally movable shielded device linking the wafer probe with the test instrument.
Figure 8:
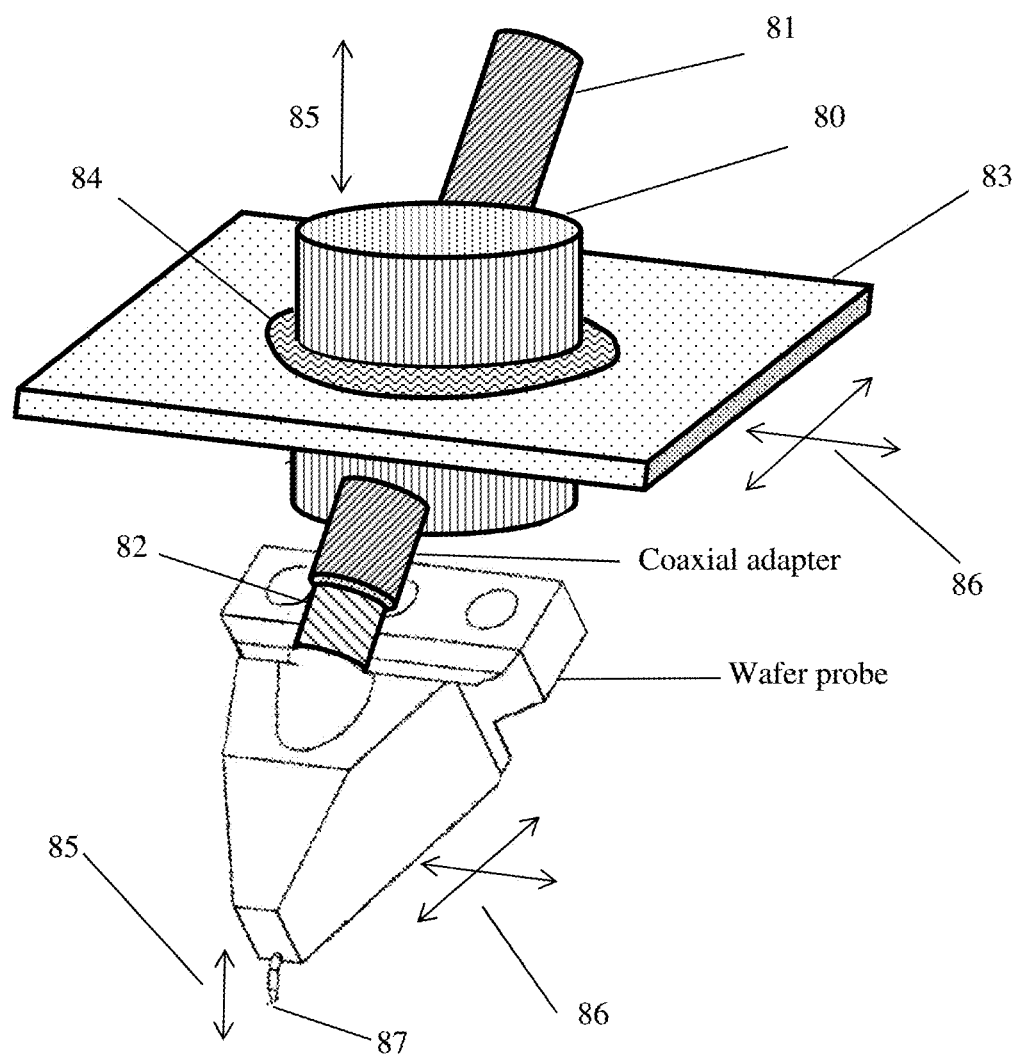
FIG. 8 depicts a 3D view of the shielding link device of FIG. 7.
Figure 9:
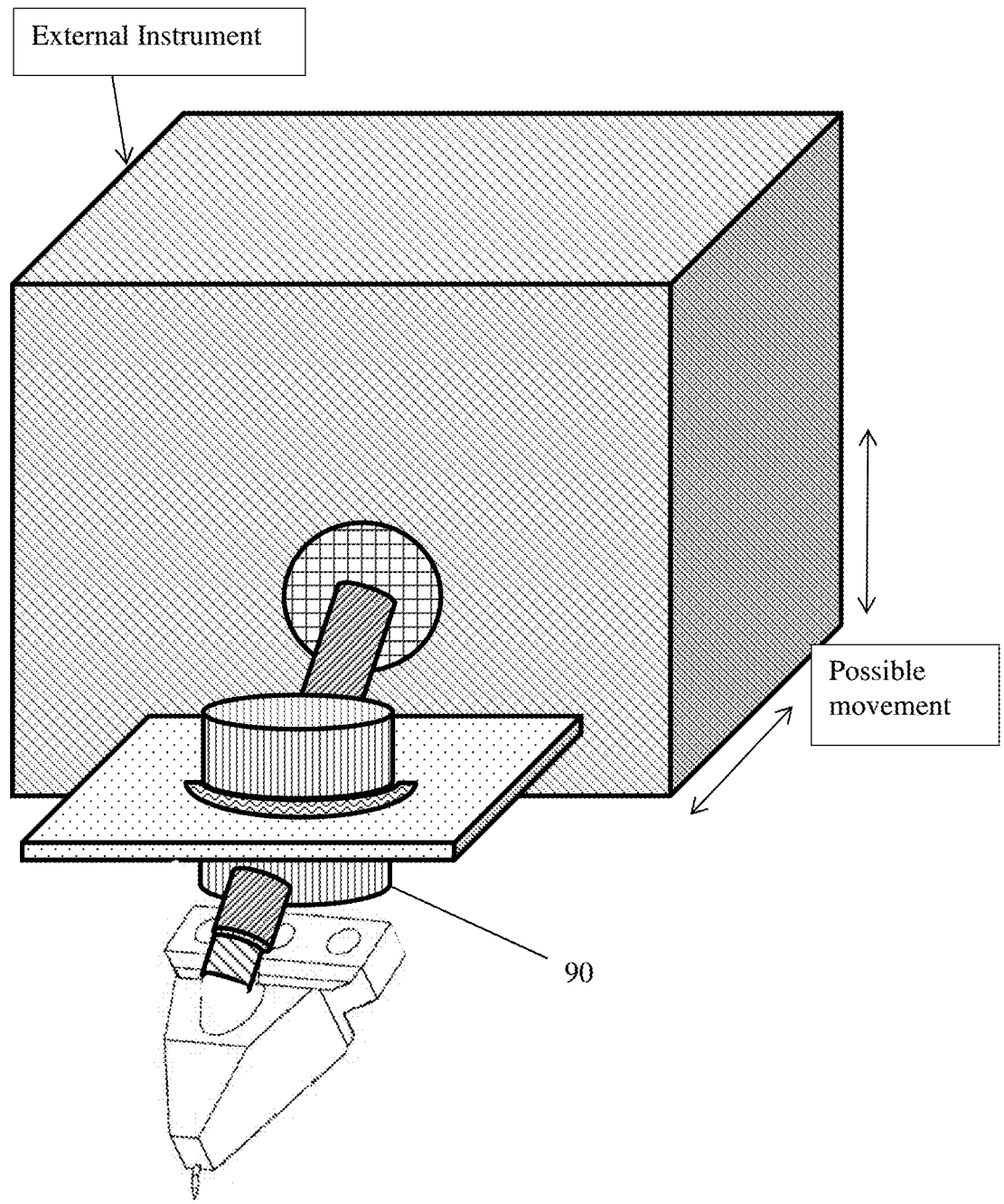
FIG. 9 depicts the complete assembly of the shielding device, the wafer probe and the rigid link to a test instrument (mechanical impedance tuner).

The proposed assembly is best shown in FIG. 8. A sloped conductive tube (81) traverses a solid vertical cylinder (80), which serves as support and vertical guide against the cover plate (83). The cylinder (80) is sealed with the plate (83) using a flexible rubber gasket or O-ring (84) which can embedded in a slot inside the edge of the hole in the plate (shown also in cross section as item (74) in FIG. 7). This rubber gasket or O-ring (84) is a key element in the setup: it allows sealed vertical (85) sliding of the cylinder (80) against the plate (83), but also small deviations ((73) in FIG. 7) from the nominal vertical direction. Such deviations (73) are often in-avoidable in manufacturing angled parts; the prior art solution of FIG. 5A does not tolerate such deviations, since the tube (50) is slide fitting mounted against the plate (53) and can only slide under the specific mounting angle (56), and the plate (53) must make hermetic, horizontal (55) only, sliding contact (52) with the cover (57) of the cavity (58).

The cover plate (83) can slide horizontally in X and Y directions (86) in order to allow the probe tip (87) to be positioned exactly above the semiconductor chip to be tested. Typically, and in order to ensure perfect sealing, the plates (83) shall be secured with brackets (two pieces (102) per cover plate in FIG. 10), after the final positioning of the probes. The cover plate (70), (83) must also comprise a sealing gasket or rubber O-ring (77) between their bottom and the cavity cover (75). The actual position of the probe tips (103) can be observed through the glass window (104) using a microscope, as shown in FIG. 3. Once the probe tip (87) is positioned close above the chip to be tested, the cover plate (83) is secured (immobilized) using appropriate brackets (102).

Special attention is to be paid to the item (84) in FIG. 8. It has been described above as a rubber O-ring. This, however is only one alternative. This joint is a critical item in the setup. It is a preferred alternative to a rigid metal-on-metal connection (area (59) in FIG. 5A), which would not allow for any manufacturing-caused misalignment (73). However this joint (84) must be hermetical as well. Again there are two types of hermeticity: (a) liquid/gas hermeticity and (b) RF hermeticity (EMI "Electro-Magnetic-Interference") shielding). In the first case a rubber or Teflon shield in form of an O-ring will be sufficient. In the second case a rubber joint enveloped in a conductive mesh, commercially available under the brand name "EMI shielding gasket or foam" is required (see ref. 6). In case both gas and RF shielding is required the joint must be a combination of both, arranged around the cylinder (80), in a stacked form. In case only gas hermeticity of the cavity (76) is required, the cylinder (80), (71) shall be made of polished plastic or Teflon, for better sliding capacity against the O-ring. In any case, though, both, vertical travel distance and angle misalignment are expected to be small. Vertical travel of the order or less than 10 millimeters and angle "D" misalignment of typically less than 5 degrees versus the standard 30 or 45 degrees shall suffice.

Figure 12:
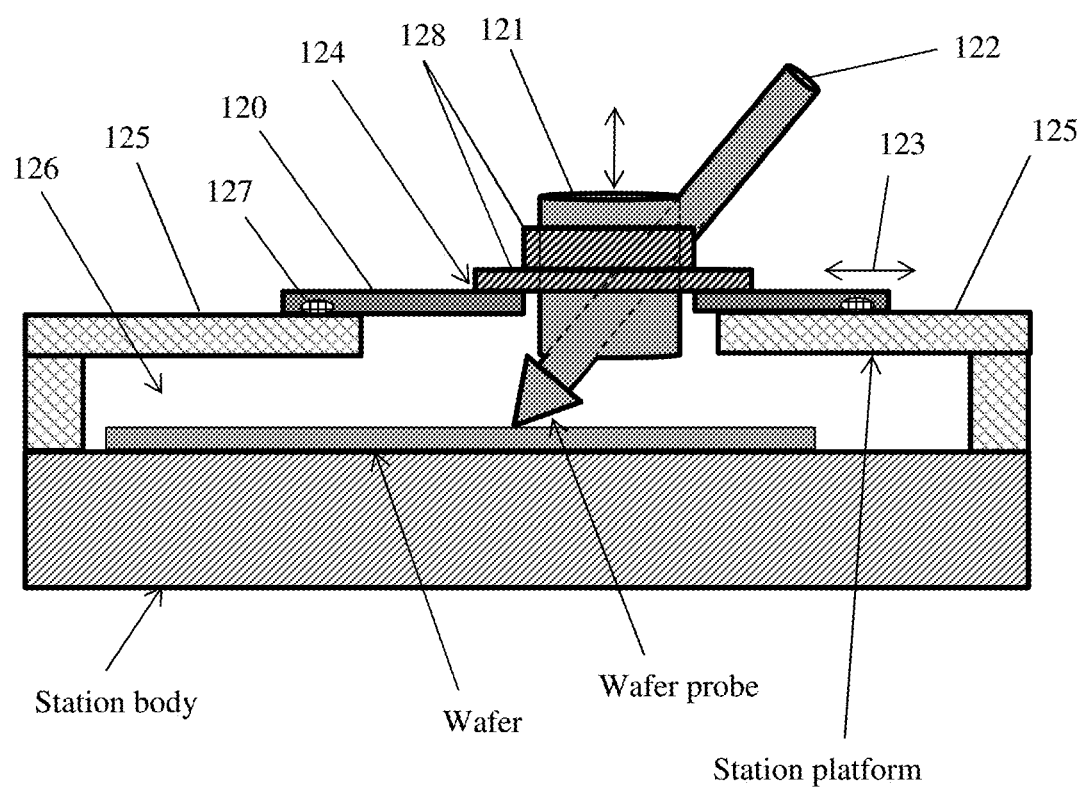
FIG. 12 depicts a cross section view of the shielding link using a collar (128) between the sliding cover plate and the coax line holding cylinder.

An alternative embodiment, suitable most for high temperature and EMI-shielded operation is shown in FIG. 12. In this case the flexible O-ring (74) has been replaced by a concentric rigid collar (128). This collar is attached permanently (124) on the mobile (123) cover plate (120), which itself is shielded against the station cover (125) using rubber or EMI-gaskets (127) as in the previous embodiment. Once the probe tip (130) is positioned close above the chip to be tested, the cover plate (120) is secured (immobilized) using appropriate brackets (102). The cylinder (121) can then slide vertically inside the collar (128), but, contrary to the embodiment of FIG. 7, the cylinder cannot tolerate mounting angle imperfections (73). The collar (128) can be made of conducting metal (brass, copper, aluminum etc.) for EMI shielding and high temperature operation in the cavity (126).

If the major concern is gas hermeticity and medium temperature operation, the collar (128) can be made of plastic material, preferably Teflon, because of its good sliding and shielding properties.

Figure 13:
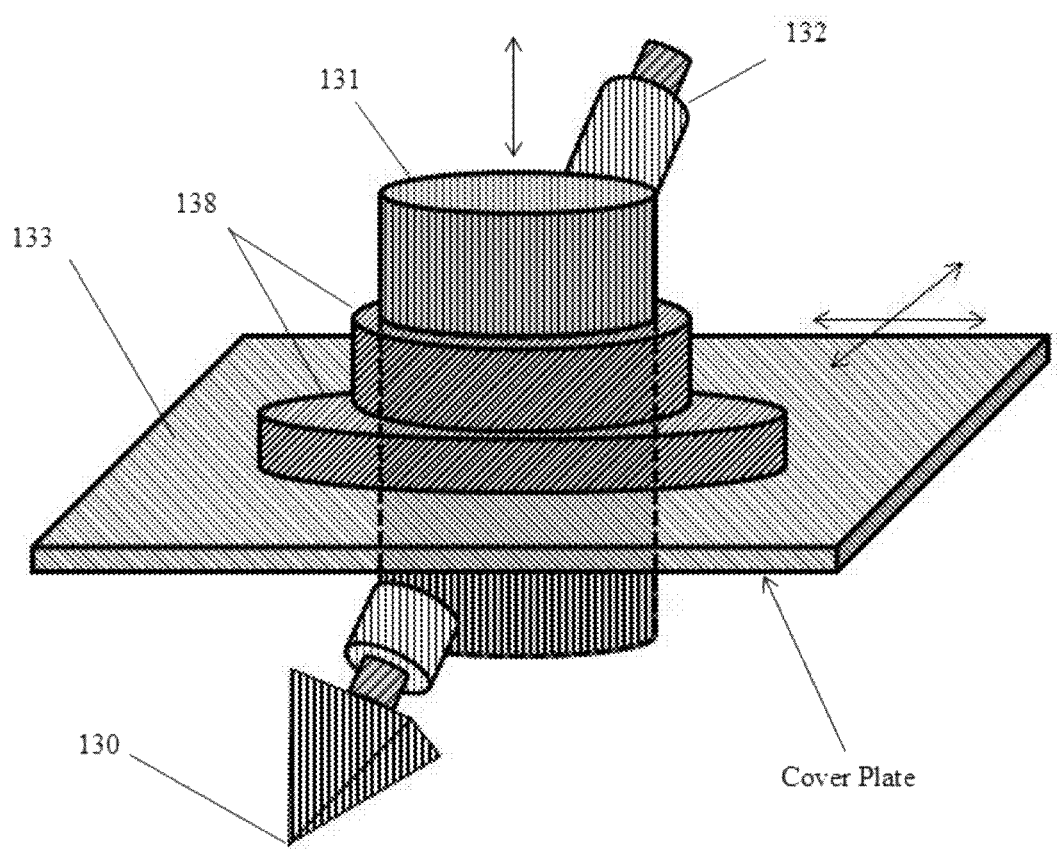
FIG. 13 depicts a detail 3D view of the shielding collar of FIG. 12.

A detailed 3D view of the embodiment of the link using a collar shielding device instead of a flexible O-ring is shown in FIG. 13. The collar (128, 138) can, obviously, be either permanently fixed on the cover (120, 133) or made as part of a single piece with the cover (120, 133), since the cover (120, 133) ensures horizontal mobility over the underlying station cover (125), while it allows vertical mobility against the cylinder (131) without a slanted movement of the coaxial line (122, 132).

Figure 15:
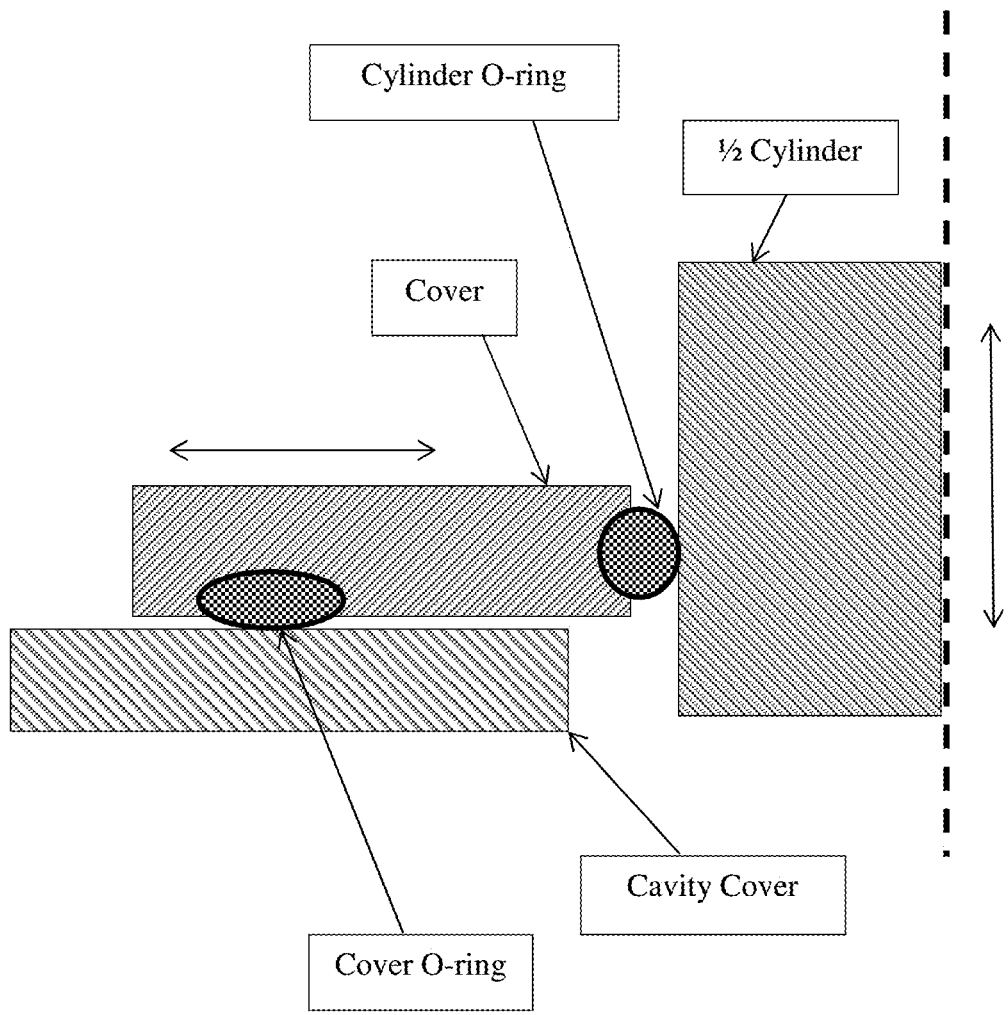
FIG. 15 depicts a view of the horizontal and vertical sealing mechanisms using rubber O-rings, one between the cover and the cavity and one between the cover and the vertical cylinder.

Hermeticity shall also be ensured between the cover plate (item (83) in FIG. 8 and (70) in FIG. 7) and the body of the station (75). This can also be ensured using embedded rubber, conductive EMI, Teflon or rubber O-rings, or a stacked combination of both (77). The window (104) can also be RF shielded when covered with a RF shielding transparent layer or EMI shielded glass (see ref. 7). Details of this configuration are shown in FIG. 15.

Figure 14:
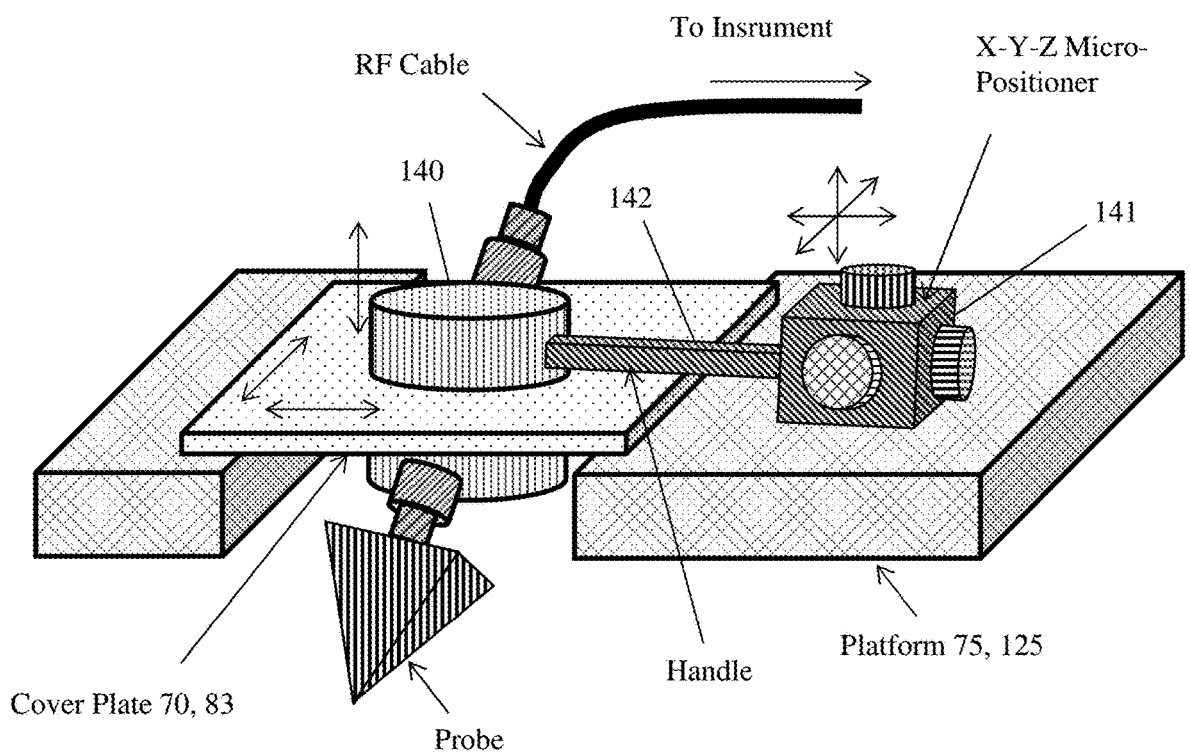
FIG. 14 depicts a 3D view of a setup in which the shielded link is controlled by an external 3 axis (X-Y-Z) micrometric positioner, employable when the probe is connected to the adjacent instrument using a semi-rigid or flexible RF cable.

In case the probes are connected to the associate instruments using flexible RF cables (FIG. 14) the sealed cylindrical holder (140) shall be controlled by an external 3-axis (X-Y-Z) micro-positioner (141) through a rigid connection handle (142), which is firmly attached at both ends to the cylinder (140) and the micro-positioner (141). The positioner itself is mounted independently on the wafer probe station platform.

Figure 10:
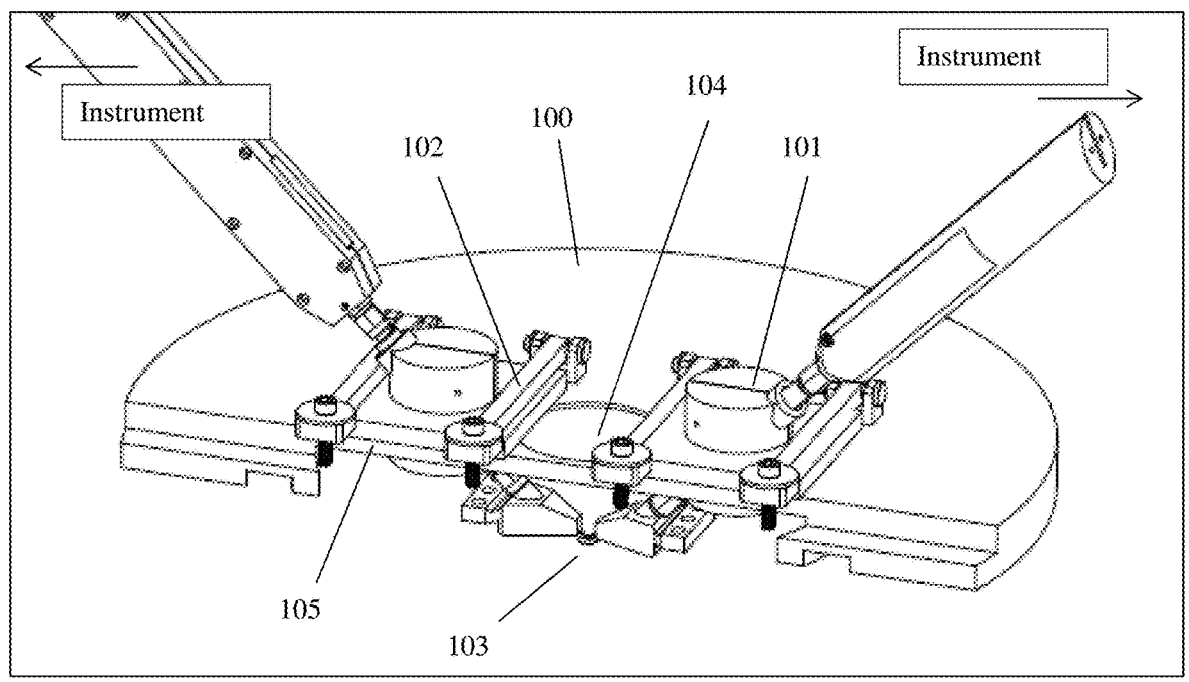
FIG. 10 depicts the 3D view of the complete assembly of the cover plate and two shielding devices for two wafer probes, with one part of the cover plate removed to view the probes and the access to the probes in order to perform "Theta" alignment.
Figure 11:
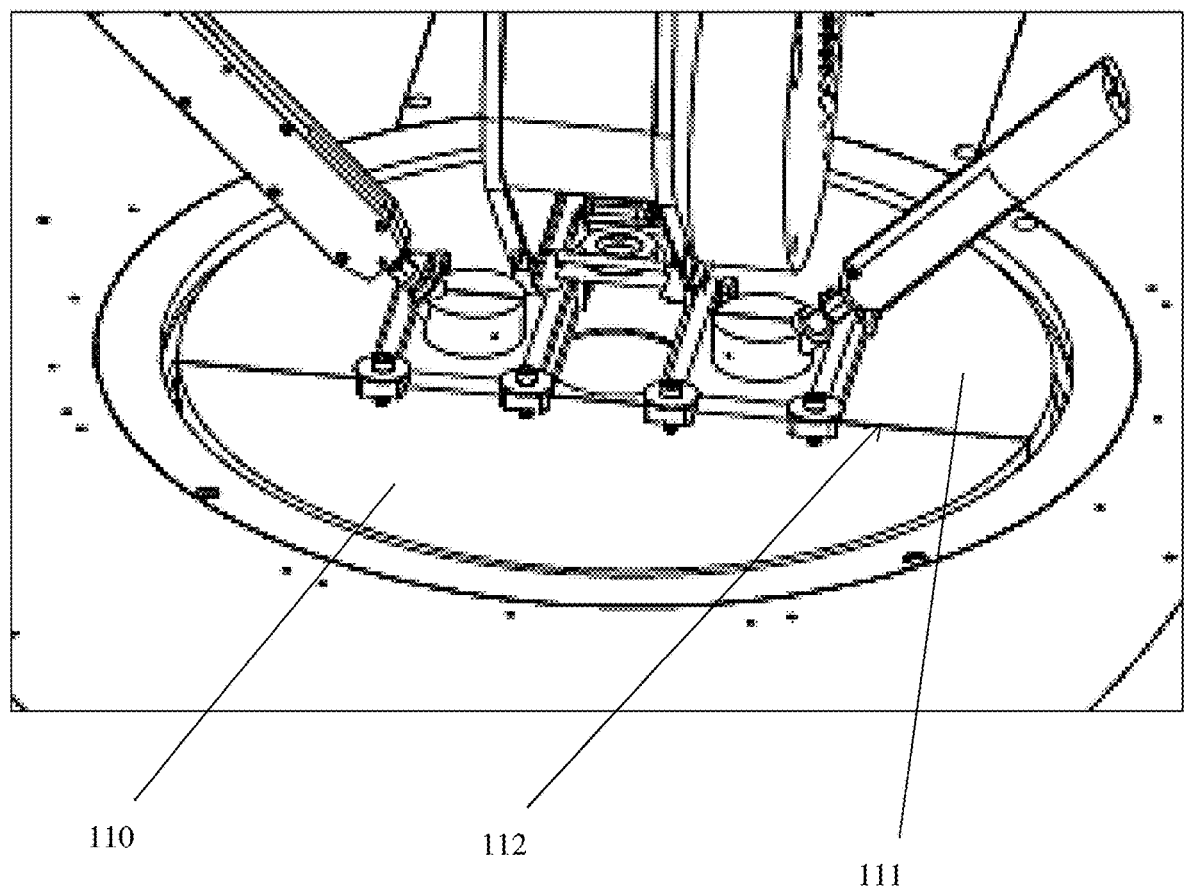
FIG. 11 depicts a 3D view of the shielded probe assembly with all components in place and closed both sections of the cover plate.

Theta alignment is important for wafer probes. FIG. 2 shows a prior art device which allows such alignment on a continuous basis. Such capacity is, however, not required, since the probes must be aligned only once. The mechanism of doing so is shown in FIG. 4; it comprises an "alignment tool" which is inserted beneath the probe and the probe is pressed against it (without semiconductor wafer in place and without the tips touching the wafer plate, obviously) and the coaxial connector is then tightened (see ref. 5). To enable connector tightening in situ with the probe holding device in place, the disc-formed cover plate (75), (100) must be made in two pieces: one piece being approximately ⅗ of the plate surface, as shown in FIG. 10, contains the glass window (104) and openings for the support plates (105); and one piece covering the remaining ⅖ of the disc which is tightened also against the station plate (78) to ensure hermeticity. Hermeticity between the two sections (110) and (111) of the cover disk plate (100) is ensured also using a straight rubber or EMI shielding gasket at the joint (112).

The present invention has been disclosed hereby in the form of a number of preferred embodiments. Obvious alternatives are imaginable, but shall not be construed to trespass on the basic idea of using a dedicated coaxial line holding device allowing hermeticity and easy manhandling of micro-positioning wafer probes in a wafer probe station environment.

What is claimed is:

1. An adjustable sealed link penetrating into a RF-EMI and thermally isolated chamber of a wafer test station for connecting load pull tuners with wafer probes,
said chamber having top cover, bottom plate and sidewalls, and holding a semiconductor wafer on its bottom plate,
said link comprising,
a section of low loss coaxial airline,
a vertical cylinder, and
a plate covering an opening in the top cover of the chamber;
wherein
the airline traverses the cylinder diagonally from top to bottom towards the wafer probe;
the cylinder slide-fits and slides vertically inside a hole in the covering plate;
the covering plate slides on the top cover of the chamber;
and wherein
all sliding contacts are hermetic, and RF-EMI shielded.

2. The link of claim 1,
wherein
the cylinder slides inside a surrounding collar which is mounted vertically on a secondary plate attached to the covering plate.

3. The link of claim 1,
wherein
the cylinder slides inside a RF-EMI sealing flexible O-ring, which is inserted between the cylinder and the hole in the covering plate.

4. The link of claim 1,
wherein
the cover plate slides on a RF-EMI-shielding gasket placed between the bottom of the cover plate and the underlying top of the chamber.

5. The link as in claim 2,
wherein
the cylinder glides vertically, slide fitting, inside the collar.

6. The link as in claim 2,
wherein
the cylinder is attached to a handle,
and wherein
the handle is attached to an external 3-axis (X-Y-Z) micro-positioner, which is attached to the platform of the wafer-probe station.

* * * * *